United States Patent [19]

Jyoko

[11] Patent Number: 5,317,802
[45] Date of Patent: Jun. 7, 1994

[54] METHOD FOR LOADING A PRINTED CIRCUIT BOARD MOUNTING LINE

[75] Inventor: Nobuhiro Jyoko, Kanagawa, Japan

[73] Assignee: Mitsubishi Denki Kabushiki Kaisha, Tokyo, Japan

[21] Appl. No.: 901,858

[22] Filed: Jun. 22, 1992

[30] Foreign Application Priority Data

Jun. 27, 1991 [JP] Japan .................. 3-156845

[51] Int. Cl.⁵ .............................. H05K 3/30
[52] U.S. Cl. .................. 29/832; 29/564.1; 29/740; 414/786
[58] Field of Search .............. 29/832, 840, 740, 741, 29/564.1; 414/786

[56] References Cited

U.S. PATENT DOCUMENTS

4,667,403  5/1987  Edinger et al. .

FOREIGN PATENT DOCUMENTS

0437634  7/1991  European Pat. Off. .
4-196296  7/1992  Japan .
2257541  1/1993  United Kingdom .

*Primary Examiner*—Carl J. Arbes
*Attorney, Agent, or Firm*—Wolf, Greenfield & Sacks

[57] ABSTRACT

A line is constructed of multi-function machines which can mount various types of parts or by connecting a plurality of dedicated machines of the same type which can mount only a specific type of part, data is extracted from parts mounting information which is different by each printed circuit board (extraction process 10), the mounting tact time of each automatic machine which is changed by type and the number of parts to be mounted is calculated (load calculation process 20), parts are transferred from an automatic machine having a large load to an automatic machine having a small load to equalize the mounting tact time of each automatic machine (alteration process 30), and NC data for each automatic machine is automatically generated (decision process 40), whereby the productivity of mounting parts on printed circuit boards can be improved.

7 Claims, 5 Drawing Sheets

| AUTOMATIC MACHINE NO. | PARTS TO BE MOUNTED | STANDARD MOUNTING TIME (SEC) |
|---|---|---|
| 1 | CHIP PARTS | 0.35 |
| | SOP | 3 |
| 2 | CHIP PARTS | 0.65 |
| | SOP | 2 |
| 3 | SOP | 3 |
| | QFP | 6 |
| 4 | OC | 4 |

| NO. OF PARTS TO BE MOUNTED | |
|---|---|
| CHIP PARTS | 260 |
| SOP | 20 |
| QFP | 10 |
| OC | 10 |

SOP: SMALL OUTLINE PACKAGE
QFP: QUAD FLAT PACKAGE
OC : ODDLY COMPONENT
IC : INTEGRATED CIRCUIT

WHAT IS PARTS MOUNTING INFORMATION:
NAME OF PARTS TYPE; COORDINATES FOR MOUNTING PARTS; MOUNTING DIRECTION; DIVISION BY INSERTION/MOUNTING, BY FRONT/REAR OF PRINTED CIRCUIT BOARD, BY EACH AUTOMATIC MACHINE, etc.

FIG.7 PRIOR ART

| AUTOMATIC MACHINE NO. | PARTS TO BE MOUNTED | *1 STANDARD MOUNTING TIME (SEC) | NO. OF PARTS TO BE MOUNTED | *2 TACT TIME |
|---|---|---|---|---|
| 1 | CHIP PARTS | 0.35 | 260 | 91 |
| 2 | SOP | 2 | 20 | 40 |
| 3 | QFP | 6 | 10 | 60 |
| 4 | OC | 4 | 10 | 40 |

LINE TACT TIME: 91 SEC (*1) STANDARD MOUNTING TIME: TIME REQUIRED FOR MOUNTING A SINGLE TYPE OF PARTS (*2) TACT TIME: TIME REQUIRED FOR ASSEMBLING A SINGLE PRINTED CIRCUIT BOARD

METHOD FOR LOADING A PRINTED CIRCUIT BOARD MOUNTING LINE

BACKGROUND OF THE INVENTION

1. [Field of the Invention]

The present invention relates to a method of generating data for parts mounters, and more particularly, to a method of constructing an automatic mounting line with automatic machines for automatically inserting or mounting parts on printed circuit board and a method of generating numerical control (NC) data for each automatic machine.

2. [Description of the Prior Art]

FIG. 4 is a diagram of a computer system which implements such a prior art method for generating NC data for hybrid printed circuit boards as disclosed in Japanese Patent Publication No. 1-100605. In the figure, reference numeral 101 represents a processor, 102 a magnetic disk unit, 103 a floppy disk drive unit, 104 a display unit, 105 a paper tape puncher, and 106 a line printer.

FIG. 5 illustrates an example of a line which is constructed of dedicated parts mounters (also called "automatic machine" hereinafter) which can mount a specific type of part.

FIG. 6 is a flow chart of the conventional method for generating NC data.

With reference to the flow chart of FIG. 6, the operation of the computer system will be described hereafter.

Parts mounting information (name of parts type; coordinates for mounting parts; mounting direction; division by insertion/mounting, by front/rear of a printed circuit board, and by each automatic machine for mounting a specific type of part) for each printed circuit board outputted from a substrate design CAD (computer aided design) system is first inputted and stored by the computer system shown in FIG. 4.

The parts mounting information is divided into three parts by insertion/mounting and front/rear of a printed circuit board: information on parts to be inserted, information on parts to be mounted on the front of a printed circuit board, and information on parts to be mounted on the rear of a printed circuit board. By each automatic machine, the divided information is further divided into units of information on parts to be mounted with each automatic machine shown in FIG. 5. The information divided by each automatic machine indicates data on which automatic machine can mount parts specified by type. Only one automatic machine is specified for each type of part. Finally, the data is converted into an NC format for each type of automatic machine to generate NC data.

The NC data generation procedure described in the foregoing is used when a line is constructed of dedicated automatic machines which can mount only a specific type of part shown in FIG. 5. The NC data is generated to enable an automatic machine 1 to mount chip parts, an automatic machine 2 to mount SOP-ICs (small outline package of integrated circuits), an automatic machine 3 to mount QFP-ICs (quad flat packages of integrated circuits) and an automatic machine 4 to mount OCs (oddly components).

Since the conventional line for mounting parts on printed circuit boards is constructed as described in the foregoing, it is impossible to balance the line if load is varied by changes in type and the number of printed circuit boards when parts are mounted on various types of printed circuit boards. With reference to FIG. 7 which explains this, it takes 40 seconds to mount an SOP-IC and an OC each on a single printed circuit board, but it takes 91 seconds to mount a chip part on the board. Therefore, it takes 91 seconds to assemble a single printed circuit board in the line. As a result, the automatic machines 2 and 4 operate for 40 seconds to mount an SOP-IC and an OC, but are idle for 51 seconds, thus reducing productivity.

SUMMARY OF THE INVENTION

In view of the problem with the prior art, it is an object of the present invention to provide a method of generating data for parts mounters in which the load balance of each automatic machine which is changed by type and the number of parts to be mounted which are different by each type of printed circuit board is controlled through the distribution of parts, a line is constructed of multi-function machines which can mount various types of parts, or, by connecting a plurality of dedicated machines of the same type for mounting a specific type of part, parts are distributed to equalize the mounting tact time (mounting time per board) of each automatic machine, and NC data for automatically mounting parts with each automatic machine can be automatically generated.

Therefore, the method of generating data for parts mounters of the present invention comprises the steps of:

constructing a line with multi-function parts mounters which can mount various types of parts or a plurality of dedicated machines of the same type for mounting a specific type of part, calculating the mounting tact time of each automatic machine which is changed by type and the number of parts to be mounted which are different by each type of printed circuit board (load calculation process), transferring parts from an automatic machine having a large load to an automatic machine having a small load, if there is load imbalance among the automatic machines, to equalize the mounting tact time of each automatic machine (alteration process), and automatically generating NC data for each automatic machine (decision process).

In this way, since the method of generating data for parts mounters of the present invention distributes parts to equalize the mounting tact time (load) of each automatic parts mounter of the mounting line in the alteration process, and generates data for each automatic parts mounter, the waiting time (idle time) of each automatic parts mounter can be eliminated, thus improving productivity.

The above and other objects, features, and advantages of the invention will become more apparent from the following description when taken in conjunction with the accompanying drawings.

BRIEF DESCRIPTION OF THE DRAWINGS

FIG. 7 illustrates the calculation of line tact time.

DESCRIPTION OF THE PREFERRED EMBODIMENT

Embodiment 1

Figures 1A, 1B, 1C:
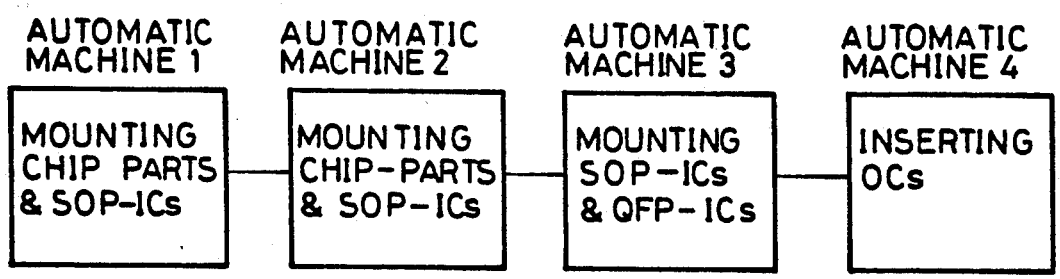
FIGS. 1A–1C show the configuration of a line for mounting hybrid printed circuit boards, the standard mounting time and the number of parts to be mounted in the line according to an embodiment of the present invention.

With reference to the accompanying drawings, an embodiment of the present invention will be described in the following. FIG. 1A is a diagram of a line for mounting parts on a hybrid printed circuit board which is constructed of multi-function machines which can mount various types of parts. In the line, an automatic machine 1 and an automatic machine 2 can mount chip parts and SOP-ICs, and an automatic machine 3 can mount SOP-ICs and QFP-ICs. An automatic machine 4 inserts OCs.

Figure 2:
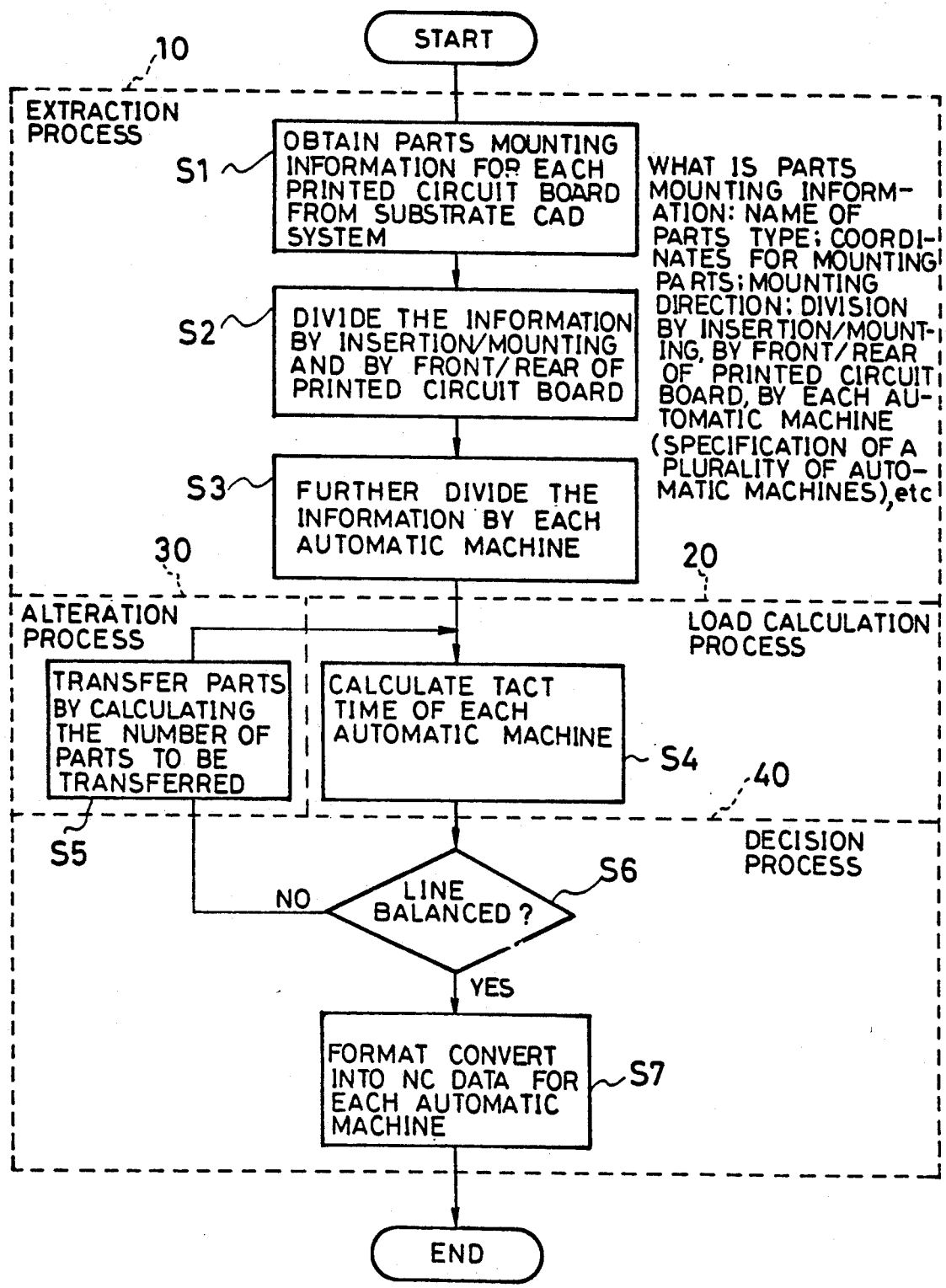
FIG. 2 is a flow chart for generating NC data in consideration of tact balance.

FIG. 2 is a flow chart of the embodiment. Reference numeral 10 represents a process for extracting parts mounting data for calculating the load of each parts mounter from parts mounting information, 20 a process for calculating the load of each parts mounter from inputted parts mounting data, 30 an alteration process for changing the parts mounting data so that load calculated in the previous load calculation process becomes equal among the parts mounters, and 40 a decision process for taking the parts mounting data as final data when load balance among the parts mounters calculated in the load calculation process 20 falls within the predetermined range.

Figure 4:
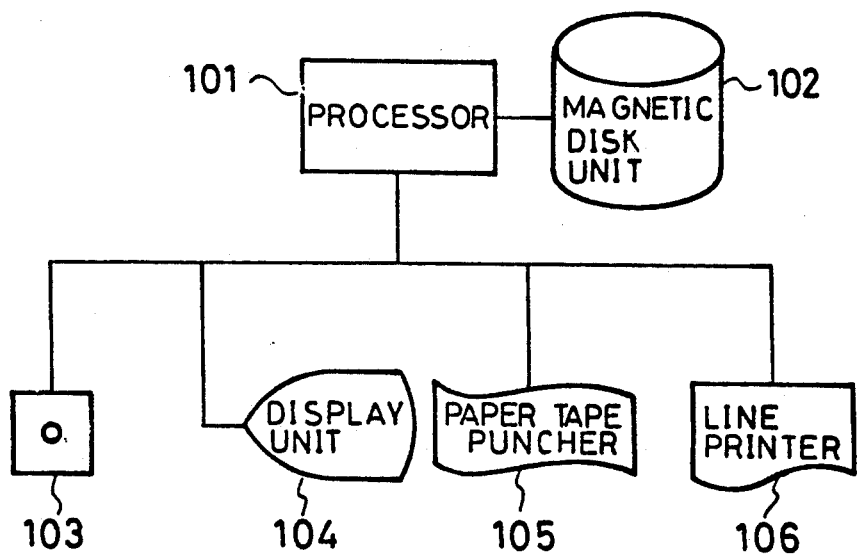
FIG. 4 shows the configuration of a computer system according to the prior art and the present invention.
Figure 5:
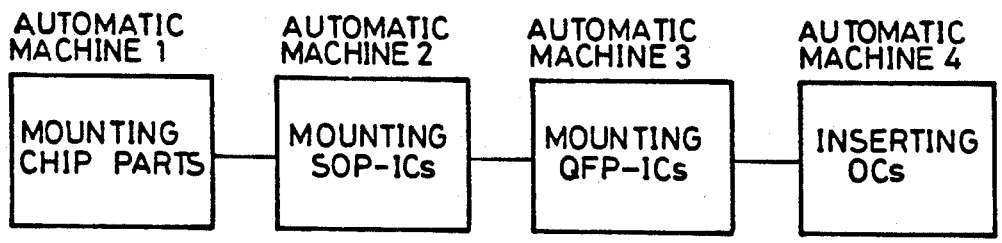
FIG. 5 illustrates the configuration of a line for mounting hybrid printed circuit boards of the prior art.
Figure 6:
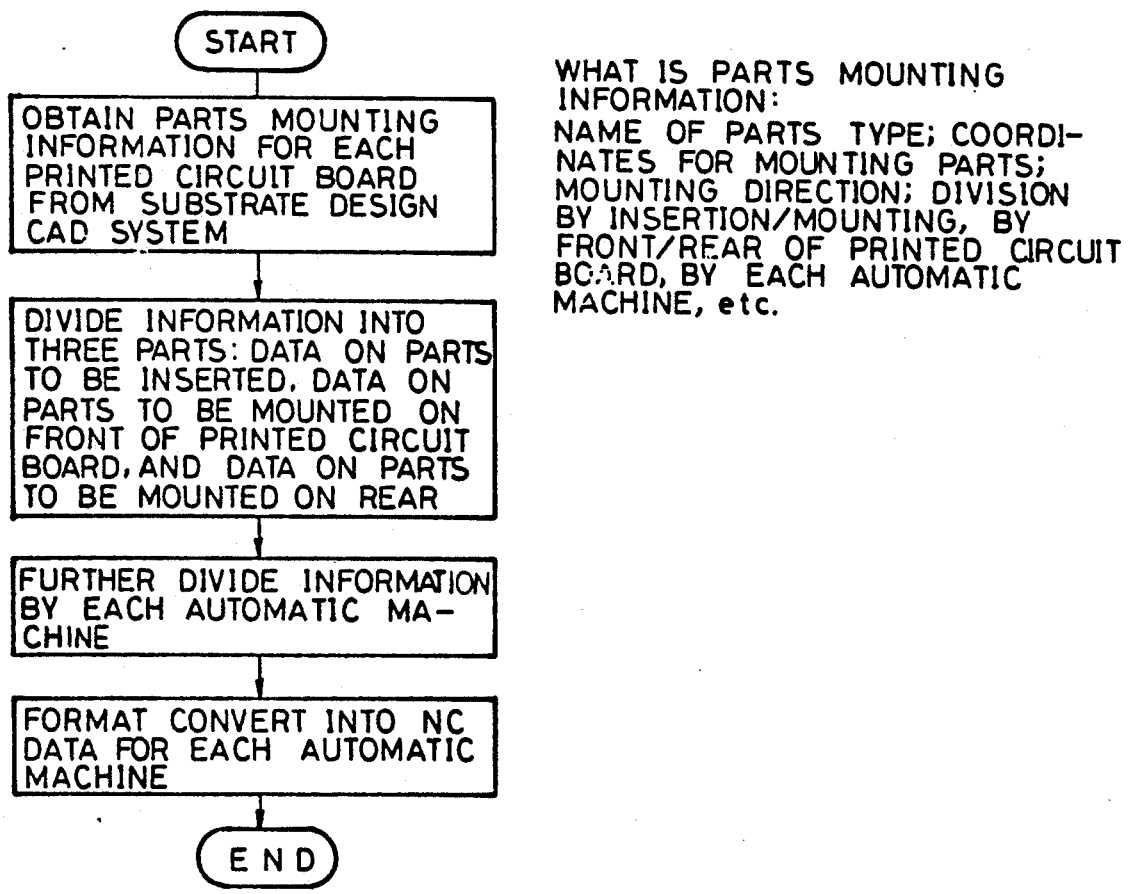
FIG. 6 is a flow chart of the method of generating NC data of the prior art.

With reference to the flow chart of FIG. 2, the operation of each process will be described. The operational flow of FIG. 2 is executed by the computer system of FIG. 4.

(a) extraction process

Parts mounting information (type of parts; coordinates for mounting parts; mounting direction; division by insertion/mounting, by front/rear of the printed circuit board, by each automatic machine, and other data) for each printed circuit board outputted from a substrate design CAD system is first inputted and stored in step S1.

In step S2, the parts mounting information is divided into three parts by insertion/mounting and front/rear of a printed circuit board: information on parts to be inserted, information on parts to be mounted on the front of the printed circuit board, and information on parts to be mounted on the rear of the printed circuit board. In step S3, the parts mounting information is further divided by each automatic machine as shown in FIG. 1. In this embodiment, the automatic machines 1 and 2 can mount chip parts and SOP-ICs, and the automatic machine 3 can mount SOP-ICs and QFP-ICs. However, the information is divided on condition that the automatic machine 1 mounts chip parts, the automatic machine 2 mounts SOP-ICs, the automatic machine 3 mounts QFP-ICs, and the automatic machine 4 mounts OCs.

In this way, in the extraction process 10, parts mounting data required for each automatic machine is generated from the parts mounting information.

(b) load calculation process

Thereafter, in step S4, the mounting tact time of each automatic machine (time required for mounting parts on a single printed circuit board) is calculated from the following equation.

$$\text{mounting tact time of automatic machine } j = \sum_{i=1}^{4} (\text{standard time required for mounting } K_i \text{ with automatic machine } j) \times (\text{number of } K_i \text{ to be mounted with automatic machine } j) \quad (1)$$

wherein $K_i$ represents type of part to be mounted and $j$ represents a numeral from 1 to 4. In FIG. 1, K1 represents chip parts, K2 SOP-ICs, K3 QFP-ICs and K4 OCs.

(c) alteration process

When the mounting tact times of automatic machines 1 to 4 are almost equal, by proceeding from S6 to S7, the parts mounting data is format converted into NC data for each automatic machine to finish processing. However, if there are differences in mounting tact time among the automatic machines, parts are moved in step S5 to adjust load.

For example, if the mounting tact time of the automatic machine 1 is longer than the mounting tact time of the automatic machine 2, parts are transferred from the automatic machine 1 to the automatic machine 2. The number of parts to be transferred is achieved from the following equation.

$$\text{Number of parts to be transferred} = \frac{(\text{mounting tact time of automatic machine 1} - \text{mounting tact time of automatic machine 2})}{(\text{standard time required for mounting } k_i \text{ with automatic machine 1} + \text{standard time required for mounting } k_i \text{ with automatic machine 2})} \quad (2)$$

For another example, if the mounting tact time of the automatic machine 1 is longer than the mounting tact time of the automatic machine 2, and the mounting tact time of the automatic machine 3 is longer than the mounting tact time of the automatic machine 2, parts are first transferred to the automatic machine having the maximum mounting tact time. For instance, in the above case, if the mounting tact time of the automatic machine 1 is longer than the mounting tact time of the automatic machine 3, parts are transferred to the automatic machine 1 to reduce the mounting tact time thereof as the mounting tact time of the automatic machine 1 is the maximum.

(d) decision process

After parts have been distributed in the above procedure, and the mounting tact times of the automatic machines 1 to 4 have been equalized, the parts mounting information is format converted into NC data for each automatic machine in step S7 to finish processing.

This procedure will be explained based on the standard mounting time and the number of parts to be mounted shown in FIG. 1B and FIG. 1C with reference to examples. For example, the mounting tact time of the automatic machine 1 is calculated from the equation 1 as the automatic machine 1 is used to mount only K1 (chip parts), and the mounting times and the numbers of K2, K3 and K4 are zero.

mounting tact time of automatic machine $1 = 0.35 \times 260 = 91$

Likewise, the mounting tact times of the automatic machines 2, 3 and 4 are calculated as follows:

mounting tact time of automatic machine $2 = 2 \times 20 = 40$ mounting tact time of automatic machine $3 = 6 \times 10 = 60$ mounting tact time of automatic machine $4 = 4 \times 10 = 40$ Next, if it is judged in step S6 that load is not balanced, by returning to S5, the number of parts to be transferred is calculated from the equation 2. Since the automatic machine 1 has the maximum tact time, the number of parts to be transferred to the automatic machine 1 is calculated as follows with reference to the example of FIG. 1.

mounting tact time of automatic machine $1 = 91$
mounting tact time of automatic machine $2 = 40$
standard time required for mounting K1 with automatic machine $1 = 0.35$
standard time required for mounting K1 with automatic machine $2 = 0.65$
number of parts to be transferred $= (91 - 40)/(0.35 + 0.65) = 51/1.00 = 51$ Therefore, 51 units of K1 (51 chip parts) should be transferred from the automatic machine 1 to the automatic machine 2.

In this way, by returning to S4, tact time is calculated again as follows.

mounting tact time of automatic machine $1 = 0.35 \times (260 - 51) = 73.15$
mounting tact time of automatic machine $2 = 2 \times 20 + 51 \times 0.65 = 73.15$ Therefore, the tact time is reduced from a maximum of 91 to 73.15.

Next, to reduce the maximum tact time of 73.15 in S5, the number of SOP-ICs to be transferred from the automatic machine 2 to the automatic machine 3 is calculated as follows. number of SOP-ICs to be transferred $= (73.15 - 60)/(2 + 3) \approx 2.6$ (count fractions of 0.5 and over as a unit and cut away the rest) $\approx 3$ The tact time is calculated in S4 as follows.

mounting tact time of automatic machine $2 = 2 \times (20 - 3) + 51 \times 0.65 = 66.15$
mounting tact time of automatic machine $3 = 3 \times 3 + 6 \times 10 = 69$ Thereafter, the number of chip parts to be transferred from the automatic machine 1 to the automatic machine 2 is calculated again in S5.

number of chip parts to be transferred $= (73.15 - 66.15)/(0.35 + 0.65) = 6$

The tact time is calculated in S4 as follows.

mounting tact time of automatic machine $1 = 0.35 \times 203 = 71.05$
mounting tact time of automatic machine $2 = 2 \times 17 + (51 + 6) \times 0.65 = 71.05$ At this time, the mounting tact time of each automatic machine is as follows.

mounting tact time of automatic machine $1 = 71.05$
mounting tact time of automatic machine $2 = 71.05$
mounting tact time of automatic machine $3 = 69$
mounting tact time of automatic machine $4 = 40$ At this time, the maximum tact time has been reduced from 91 to 71.05.

Changes in the tact time among the automatic machines are reduced gradually by repeating such calculations, and to nothing eventually. The parts mounting data at this time is considered as final data.

As described in the foregoing, this embodiment illustrates the method of generating NC data for hybrid printed circuit boards in a mounting line constructed of multi-function machines which can mount various types of parts when electronic parts, including parts to be inserted and mounted on both of the front and rear of various types of printed circuit boards, are installed with automatic machines, comprising the steps of: (1) inputting and storing parts mounting information for each printed circuit board generated by a substrate design CAD system, (2) calculating the load (mounting time) of each automatic machine which is changed by type and the number of parts to be mounted which are different by each printed circuit board, (3) distributing parts to equalize the load of each automatic machine, and (4) automatically generating NC data for automatically mounting parts with each automatic machine.

Embodiment 2

Figure 3:
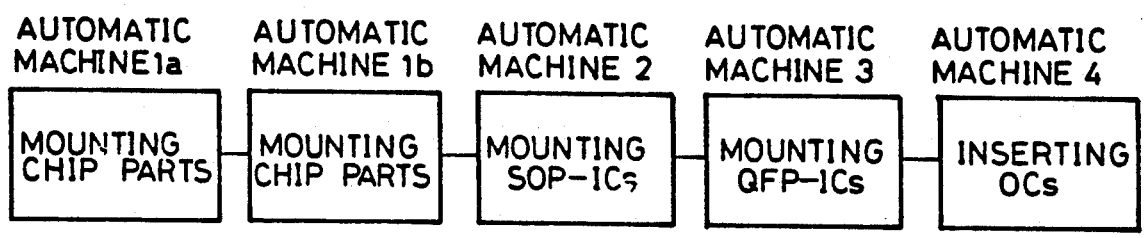
FIG. 3 illustrates the configuration of another embodiment of the present invention.

In the embodiment of FIG. 1, the line is constructed of automatic machines which can mount various types of parts. The same effects as Embodiment 1 can be achieved when a plurality of dedicated machines of the same type such as the automatic machine 1a and 1b shown in FIG. 3 are connected.

According to the present invention, the load of each automatic machine is calculated, and parts are distributed to equalize the load of each automatic machine, and data for each automatic machine is generated, thus making it possible to improve the productivity of mounting parts on printed circuit boards.

What is claimed is:

1. A method of loading a printed circuit board mounting line having a plurality of parts mounters, each mounter capable of mounting parts onto a printed circuit board, comprising the steps of:
   (a) extracting, from a memory, parts mounting data;
   (b) calculating a tact time for each parts mounter using said parts mounting data;
   (c) modifying said parts mounting data by reassigning parts to different parts mounters to improve tact time balance; and
   (d) loading parts into said parts mounters in accordance with said parts mounting data when tact time balance falls within a predetermined range.

2. A method according to claim 1, wherein each parts mounter is a multi-function machine which can mount various types of parts.

3. A method according to claim 1, wherein each parts mounter is a dedicated machine which can mount only a specific type of part, and a plurality of said dedicated machines of the same type are connected.

4. A method according to claim 1, wherein the type and the number of parts to be mounted on a printed circuit board may differ from one printed circuit board to the next.

5. A method according to claim 1, wherein said plurality of parts mounters includes at least one multi-function parts mounter.

6. A method according to claim 1, wherein said plurality of parts mounters includes at least one dedicated parts mounter.

7. A method of a loading a printed circuit board mounting line having a plurality of parts mounters, each mounter capable of mounting parts onto a printed circuit board, comprising the steps of:
   (a) retrieving, from a memory, parts mounting data, including parts mounting data for every part to be mounted on a given printed circuit board;
   (b) using said parts mounting data to calculate a tact time for each of said mounters;

(c) using said parts mounting data and said tact times to modify said parts mounting data by reassigning a given part from one mounter to another mounter, in accordance with a formula designed to better balance said line; and (d) loading a given part into a mounter in accordance with parts mounting data associated with said given part, when said line is balanced within a predetermined range.

* * * * *